(12) United States Patent
Nomaru et al.

(10) Patent No.: US 11,007,605 B2
(45) Date of Patent: May 18, 2021

(54) LASER PROCESSING APPARATUS

(71) Applicant: DISCO CORPORATION, Tokyo (JP)

(72) Inventors: Keiji Nomaru, Tokyo (JP); Yuji Hadano, Tokyo (JP); Masatoshi Nayuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 389 days.

(21) Appl. No.: 16/168,256

(22) Filed: Oct. 23, 2018

(65) Prior Publication Data
US 2019/0118303 A1 Apr. 25, 2019

(30) Foreign Application Priority Data
Oct. 24, 2017 (JP) .............................. JP2017-205276

(51) Int. Cl.
| | |
|---|---|
| B23K 26/14 | (2014.01) |
| B23K 26/359 | (2014.01) |
| H01L 21/67 | (2006.01) |
| B23K 26/38 | (2014.01) |
| B23K 26/142 | (2014.01) |
| B23K 26/00 | (2014.01) |
| B23K 26/06 | (2014.01) |
| B23K 26/067 | (2006.01) |

(52) U.S. Cl.
CPC ........ *B23K 26/359* (2015.10); *B23K 26/0006* (2013.01); *B23K 26/067* (2013.01); *B23K 26/0648* (2013.01); *B23K 26/0665* (2013.01); *B23K 26/142* (2015.10); *B23K 26/38* (2013.01); *H01L 21/6715* (2013.01); *H01L 21/6719* (2013.01); *H01L 21/67092* (2013.01)

(58) Field of Classification Search
None
See application file for complete search history.

(56) References Cited

U.S. PATENT DOCUMENTS

2005/0045090 A1\* 3/2005 Ikegami ............. B23K 26/0732
117/8

FOREIGN PATENT DOCUMENTS

| JP | 03047692 A | \* | 2/1991 |
|---|---|---|---|
| JP | 10305420 A | | 11/1998 |
| JP | 2002192370 A | | 7/2002 |
| JP | 2004188475 A | | 7/2004 |
| JP | 2014221483 A | | 11/2014 |

\* cited by examiner

*Primary Examiner* — Geoffrey S Evans
(74) *Attorney, Agent, or Firm* — Greer Burns & Crain Ltd.

(57) ABSTRACT

A liquid supply mechanism disposed over a holding unit of laser processing apparatus includes a liquid chamber having a circular-disc-shaped transparent plate positioned to form a gap between the circular-disc-shaped transparent plate and an upper surface of the workpiece held by the holding table, a liquid supply nozzle that supplies a liquid from one side of the liquid chamber to the gap, a liquid discharge nozzle that discharges the liquid from the other side of the liquid chamber, and a rotation mechanism that rotates the circular-disc-shaped transparent plate and generates a flow velocity in the liquid supplied to the gap. The laser beam irradiation unit includes a laser oscillator that emits a laser beam and a condenser that condenses the laser beam emitted from the laser oscillator and irradiates the workpiece with the laser beam transmitted through the transparent plate and the liquid supplied to the gap.

2 Claims, 6 Drawing Sheets

LASER PROCESSING APPARATUS

BACKGROUND OF THE INVENTION

Field of the Invention

The present invention relates to laser processing apparatus that irradiates a plate-shaped workpiece with a laser beam to process the workpiece.

Description of the Related Art

A wafer on which plural devices such as integrated circuit (IC) and large scale integration (LSI) are formed on a surface in such a manner as to be marked out by planned dividing lines is divided into individual device chips by laser processing apparatus and the device chips obtained by the dividing are used for pieces of electronic equipment such as mobile phones, personal computers, and illumination equipment.

As the laser processing apparatus, the following types of apparatus exist: a type of apparatus that forms grooves serving as points of origin of dividing by ablation processing in which the focal spot of a laser beam with such a wavelength as to be absorbed by a workpiece is positioned at the surface of the workpiece (for example, refer to Japanese Patent Laid-open No. 10-305420); a type of apparatus that carries out irradiation in such a manner that the focal spot of a laser beam with such a wavelength as to be transmitted through a workpiece is positioned inside the workpiece, and forms modified layers serving as points of origin of dividing inside the workpiece (for example, refer to Japanese Patent No. 3408805); and a type of apparatus that carries out irradiation in such a manner that the focal spot of a laser beam with such a wavelength as to be transmitted through a workpiece is positioned inside the workpiece, and forms plural shield tunnels that reach the back surface of the workpiece from the front surface and are each composed of a fine pore serving as a point of origin of dividing and an amorphous region that surrounds this fine pore (for example, refer to Japanese Patent Laid-open No. 2014-221483). The laser processing apparatus is selected as appropriate according to the kind of workpiece, the processing accuracy, and so forth.

Particularly in the type that carries out the ablation processing among the above-described types of laser processing apparatus, there is a possibility that debris (laser processing dust) generated when the surface of a wafer is irradiated with a laser beam is scattered onto and adheres to the surfaces of devices formed on the wafer and lowers the quality of the devices. For this reason, it has been proposed that the surface of a wafer is covered by a liquid resin through which a laser beam used for processing is transmitted to prevent adhesion of debris before laser processing is carried out and this liquid resin is removed after the laser processing is carried out (for example, Japanese Patent Laid-open No. 2004-188475).

SUMMARY OF THE INVENTION

According to the technique disclosed in Japanese Patent Laid-open No. 2004-188475, due to the covering by the liquid resin, adhesion of debris to the surfaces of devices can be prevented and the processing quality is ensured. However, a step of applying the liquid resin and a step of removing the liquid resin after the processing are necessary and thus the productivity involves a program. Moreover, the liquid resin cannot be repeatedly used and therefore there is also a problem that this technique is uneconomic.

Furthermore, a technique has also been proposed in which debris is prevented from adhering to the surface of a wafer by carrying out irradiation with a laser beam in the state in which the wafer is immersed in water and causing the debris to float on the water. However, when the wafer is irradiated with the laser beam in the state in which the wafer is immersed in the water, minute bubbles are generated from the site irradiated with the laser beam on the wafer. Thus, there is a problem that traveling of the laser beam is hindered by these bubbles and desired processing cannot be carried out.

Thus, an object of the present invention is to provide laser processing apparatus with which irradiation of a plate-shaped workpiece with a laser beam is not hindered when processing is carried out by irradiating the workpiece with the laser beam.

In accordance with an aspect of the present invention, there is provided laser processing apparatus including a holding unit including a holding table that holds a plate-shaped workpiece, a laser beam irradiation unit that irradiates the workpiece held by the holding table with a laser beam and carries out processing, and a liquid supply mechanism disposed over the holding unit. The liquid supply mechanism includes a liquid chamber having a circular-disc-shaped transparent plate positioned to form a gap between the circular-disc-shaped transparent plate and an upper surface of the workpiece held by the holding table, a liquid supply nozzle that supplies a liquid from one side of the liquid chamber to the gap, a liquid discharge nozzle that discharges the liquid from the other side of the liquid chamber, and a rotation mechanism that rotates the circular-disc-shaped transparent plate and generates a flow velocity in the liquid supplied to the gap. The laser beam irradiation unit includes a laser oscillator that emits the laser beam and a condenser that condenses the laser beam emitted from the laser oscillator and irradiates the workpiece held by the holding table with the laser beam transmitted through the transparent plate and the liquid supplied to the gap.

Preferably, the laser beam irradiation unit further includes dispersing means that disperses the laser beam emitted from the laser oscillator.

According to the present invention, laser processing apparatus with which irradiation of a workpiece with a laser beam is not hindered is provided. Furthermore, if the present invention is applied to laser processing apparatus that carries out ablation processing, adhesion of debris generated at the time of laser processing to devices can be suppressed without covering the surface of a wafer by a liquid resin, and the lowering of the processing quality of the devices is prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
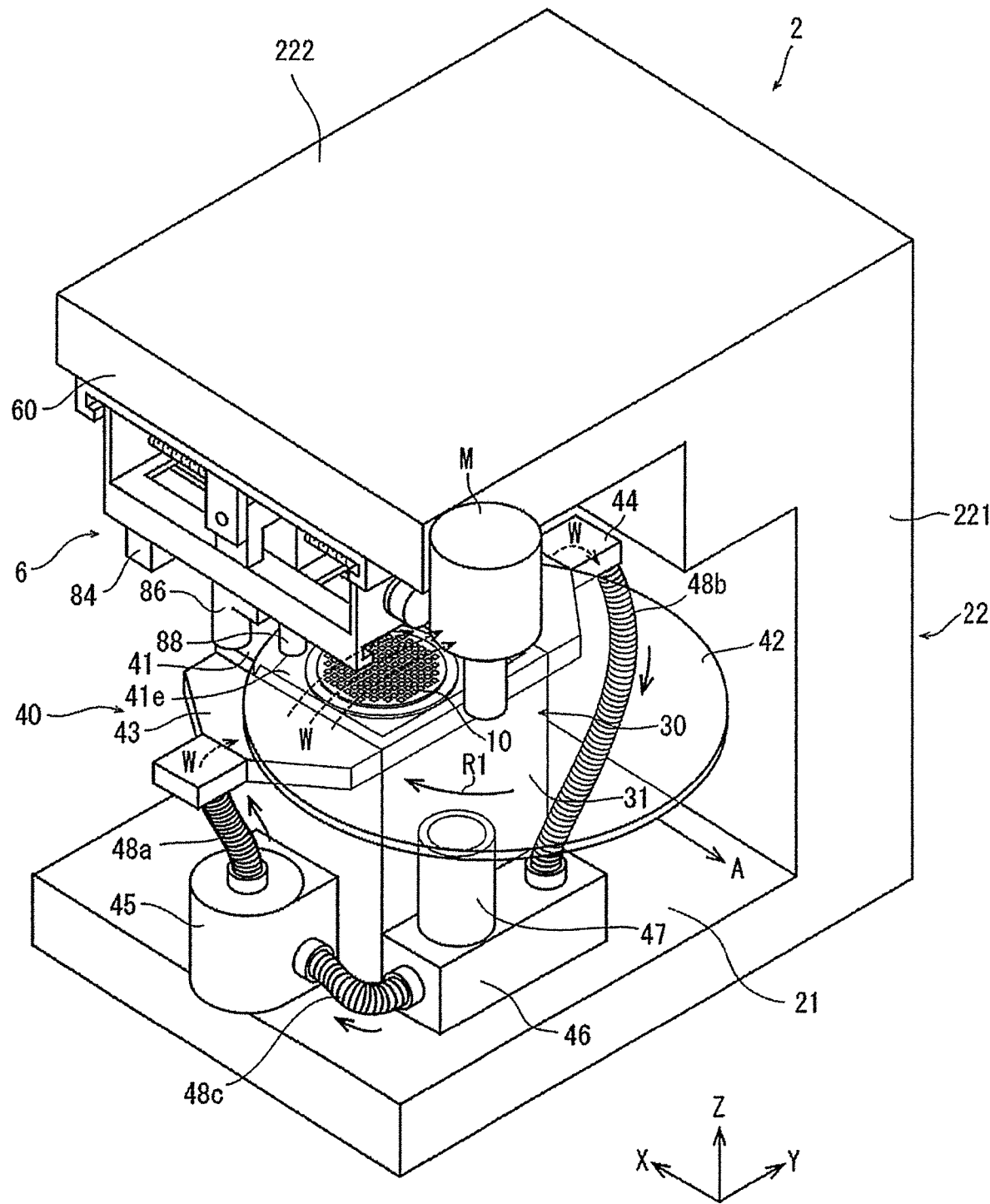
FIG. 1 is a perspective view of laser processing apparatus according to an embodiment of the present invention.

Laser processing apparatus according to an embodiment based on the present invention will be described in more detail below with reference to the accompanying drawings. In FIG. 1, a perspective view of laser processing apparatus 2 of the present embodiment is depicted. The laser processing apparatus 2 includes a base 21, a holding unit 30 that is disposed on the base 21 and holds a workpiece, and a frame body 22 composed of a vertical wall part 221 set upright along a Z-axis direction depicted by an arrow Z on a lateral side of the holding unit 30 on the base 21 and a horizontal wall part 222 that extends from the upper end part of the vertical wall part 221 in the horizontal direction. The laser processing apparatus 2 further includes a liquid supply mechanism 40 disposed on the holding unit 30 and a laser beam irradiation unit 6 disposed on the lower surface of the horizontal wall part 222.

Figure 2:
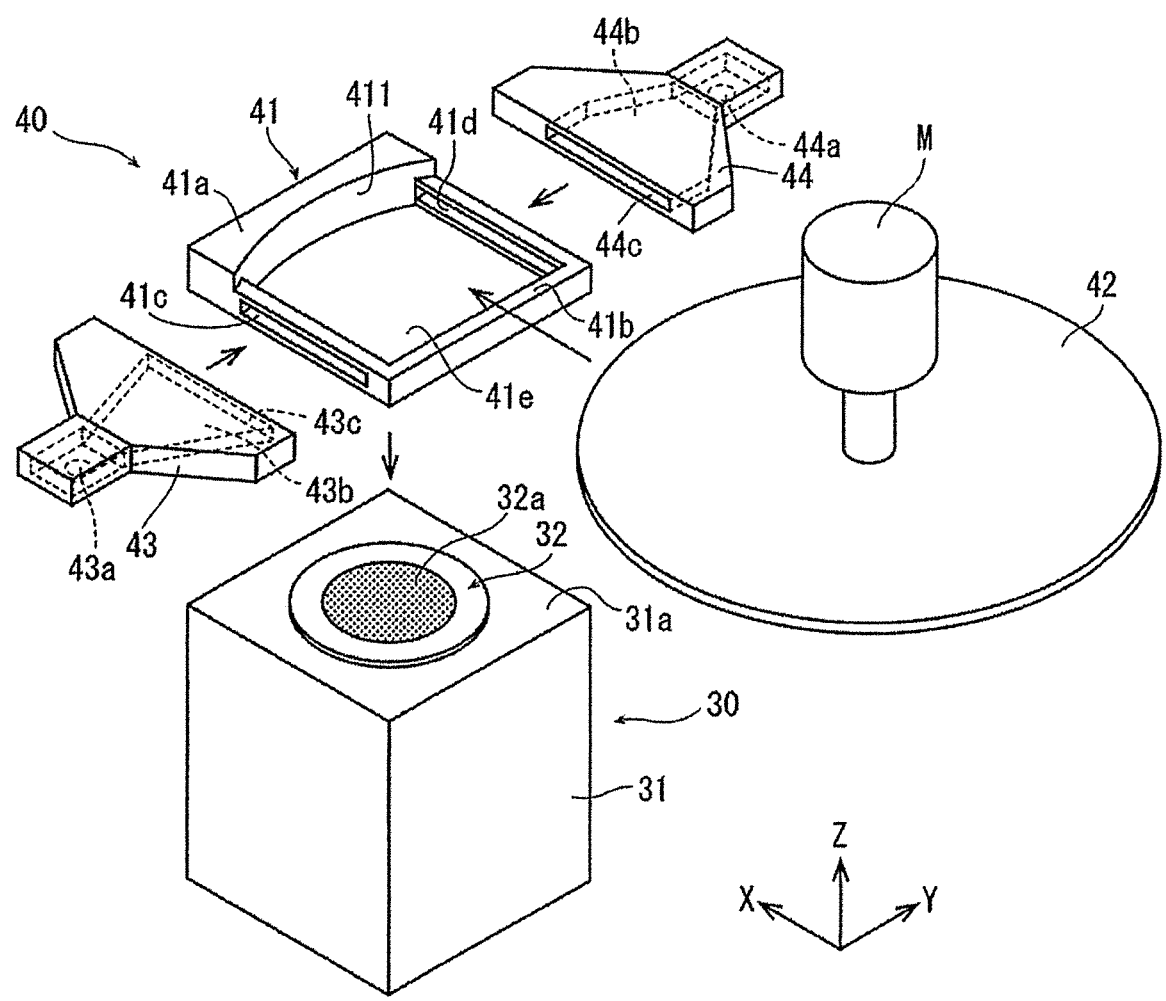
FIG. 2 is a partially exploded perspective view of a liquid chamber that forms a liquid supply mechanism and a holding unit in the laser processing apparatus depicted in FIG. 1.

FIG. 2 is an exploded diagram in which the respective configurations of the holding unit 30 and a liquid chamber 41, a liquid supply nozzle 43, and a liquid discharge nozzle 44 that form the liquid supply mechanism 40 are depicted in a disassembled manner. Each configuration will be described below.

As depicted in FIG. 2, the holding unit 30 includes a holding base 31 that is fixed onto the base 21 and has a rectangular parallelepiped shape and a holding table 32 that is disposed on an upper surface 31a of the holding base 31 and has a circular shape. The holding table 32 is configured to be capable of rotating by a revolving mechanism that is not depicted in the diagram. The central region of the holding table 32 is formed of an adhesion chuck 32a that is composed of a material having air permeability, e.g. porous ceramic, and has a circular shape. The adhesion chuck 32a is connected to a suction source that is not depicted in the diagram and sucks and holds a plate-shaped workpiece placed on the adhesion chuck 32a.

The liquid supply mechanism 40 depicted in the diagram is disposed at the upper part of the holding unit 30. Specifically, the liquid chamber 41 is placed and fixed on the upper surface 31a of the holding base 31. The liquid chamber 41 is composed of a frame base part 41a, a U-shaped frame 41b joined to the frame base part 41a, and a transparent plate 42 with a circular disc shape. The frame base part 41a is formed to have a thickness dimension larger by the thickness of the transparent plate 42 relative to the frame 41b. An inner side surface 411 of the frame base part 41a has a shape along the circular arc of the transparent plate 42 in plan view. By positioning of the transparent plate 42 on the inner side surface 411, the upper side of a space 41e formed by the frame base part 41a and the frame 41b is closed. In the frame 41b, in one of two side surfaces that are positioned in a Y-axis direction depicted by an arrow Y and are opposed to each other, a liquid supply port 41c that makes the space 41e communicate with the external is disposed. In the other side surface, a liquid discharge port 41d that makes the space 41e communicate with the external is disposed. The liquid supply port 41c and the liquid discharge port 41d extend in the horizontal direction and are formed with a dimension longer than the diameter of the adhesion chuck 32a in the respective side surfaces in which they are disposed.

The liquid supply nozzle 43 is joined to the side surface in which the liquid supply port 41c is disposed in the frame 41b. Furthermore, the liquid discharge nozzle 44 for discharging a liquid is joined to the side surface in which the liquid discharge port 41d is disposed in the frame 41b. The thicknesses of the liquid supply nozzle 43 and the liquid discharge nozzle 44 are set substantially the same as the thickness of the above-described frame 41b.

The liquid supply nozzle 43 includes a supply port 43a from which a liquid is supplied, a passage 43b through which the liquid supplied from the supply port 43a passes, and a discharge port 43c from which the liquid that has passed through the passage 43b is discharged. As depicted by dotted lines in the diagram, the supply port 43a is disposed in the lower surface of the liquid supply nozzle 43 and the passage 43b is formed inside the liquid supply nozzle 43. The discharge port 43c is formed with the same shape as the liquid supply port 41c at a position opposed to the liquid supply port 41c of the liquid chamber 41. By joining the liquid supply nozzle 43 to the liquid chamber 41, the discharge port 43c of the liquid supply nozzle 43 is made to match the liquid supply port 41c of the liquid chamber 41, which provides the state in which the supply port 43a of the liquid supply nozzle 43 communicates with the space 41e of the liquid chamber 41.

The liquid discharge nozzle 44 is formed with the same shape as the liquid supply nozzle 43. The liquid discharge nozzle 44 includes a supply port 44c from which the liquid is supplied, a passage 44b through which the liquid supplied from the supply port 44c passes, and a discharge port 44a from which the liquid that has passed through the passage 44b is discharged. As depicted in FIG. 2, the supply port 44c of the liquid discharge nozzle 44 is formed with the same shape as the liquid discharge port 41d of the liquid chamber 41 at a position opposed to the liquid discharge port 41d of the liquid chamber 41. The passage 44b is formed inside the liquid chamber 41 and the discharge port 44a is disposed in the lower surface of the liquid chamber 41. Joining the liquid supply nozzle 43 and the liquid discharge nozzle 44 to the liquid chamber 41 provides the state in which the supply port 43a of the liquid supply nozzle 43 communicates with the discharge port 44a of the liquid discharge nozzle 44 through the space 41e of the liquid chamber 41.

Packing is disposed at the edge part of the lower surface of the liquid chamber 41 across the whole circumference (diagrammatic representation is omitted). By placing the liquid chamber 41 on the upper surface 31a of the holding base 31 and making the state in which the liquid chamber 41 is closed by the transparent plate 42, a gap substantially tightly sealed is formed on the holding table 32.

The transparent plate 42 has a circular disc shape as described above and a rotating shaft of a rotation mechanism (motor M) that rotates the transparent plate 42 is fixed to the center of the transparent plate 42. The motor M is disposed on the horizontal wall part 222 of the frame body 22 as depicted in FIG. 1. The motor M rotates and thereby the transparent plate 42 is rotated in a direction depicted by an arrow R1 in the state in which the transparent plate 42 closes the liquid chamber 41 from the upper side. The transparent plate 42 is configured in such a manner that the transparent plate 42 is moved together with the motor M outward (in a direction depicted by an arrow A in FIG. 1) and the upper side of the liquid chamber 41 can be opened when a workpiece is placed on the holding table 32 and is taken out from the holding table 32. The transparent plate 42 is formed of a glass plate, for example.

Figure 3:
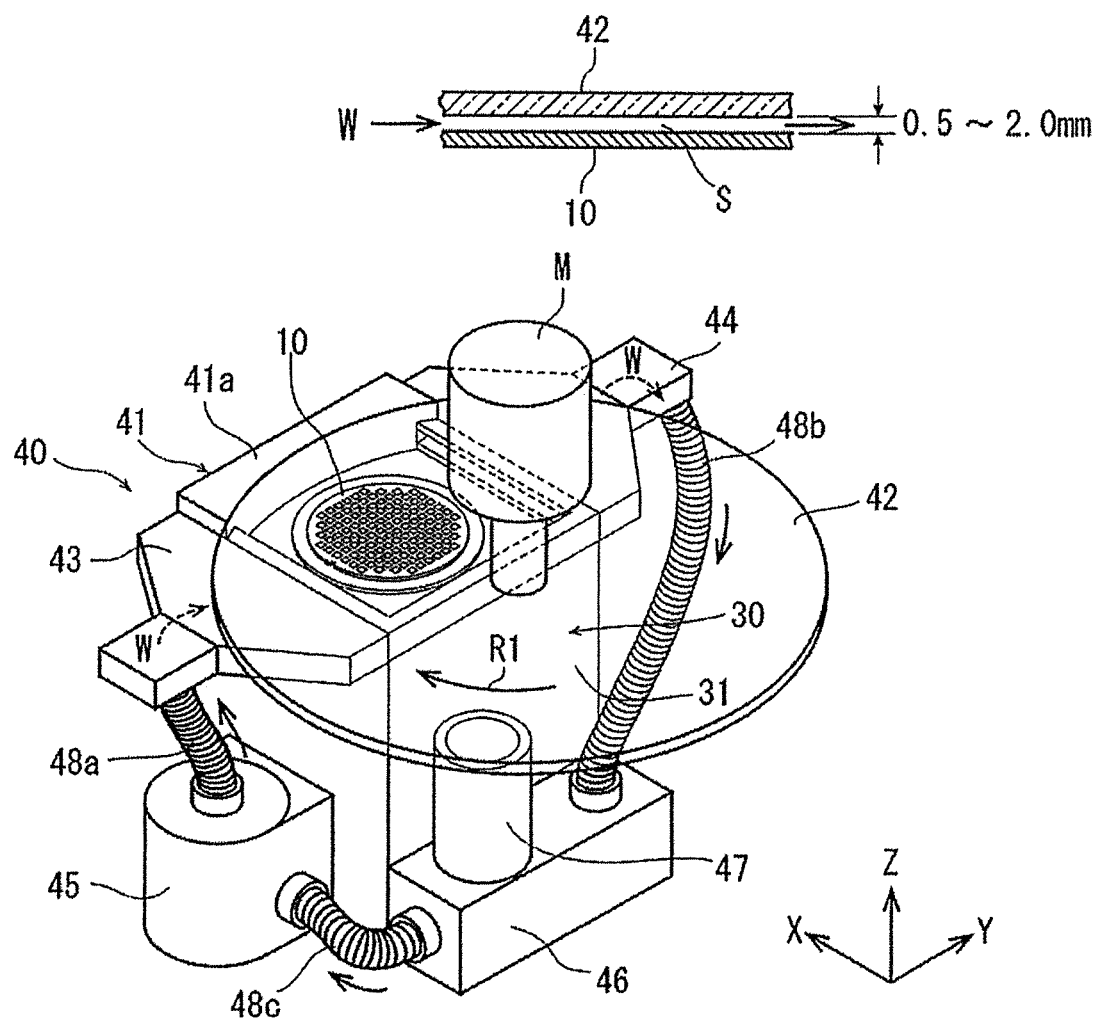
FIG. 3 is a perspective view of the liquid supply mechanism and the holding unit of the laser processing apparatus depicted in FIG. 1.

Moreover, the liquid supply mechanism 40 and the peripheral configuration of the liquid supply mechanism 40 will be described with reference to FIG. 3. In FIG. 3, the state in which a wafer 10 on which devices are formed on a surface is held by suction on the holding table 32 as a plate-shaped workpiece is depicted. As depicted on the upper side of FIG. 3 as a schematic sectional view in which part of the wafer 10 and the transparent plate 42 is enlarged, a gap S of approximately 0.5 to 2.0 mm is formed between the wafer 10 and the transparent plate 42. As depicted in FIG. 3, the laser processing apparatus 2 according to the present embodiment includes a liquid supply pump 45, a filtration filter 46, and a liquid reservoir tank 47 so that a liquid may be constantly supplied into the liquid supply mechanism 40. The liquid reservoir tank 47 is disposed on the filtration filter 46. The liquid supply pump 45 and the liquid supply nozzle 43 are connected by a first hose 48a. The liquid discharge nozzle 44 and the filtration filter 46 are connected by a second hose 48b. The filtration filter 46 and the liquid supply pump 45 are connected by a third hose 48c. The respective hoses 48a to 48c are formed of flexible hoses made of a resin.

Based on the above-described configuration, a liquid W ejected from the liquid supply pump 45 is supplied to the liquid chamber 41 via the first hose 48a and the liquid supply nozzle 43 and the liquid W supplied to the liquid chamber 41 passes through the liquid discharge nozzle 44 to be discharged. At this time, the transparent plate 42 is rotated by the motor M in the direction depicted by the arrow R1. The motor M forms the rotation mechanism that rotates the transparent plate 42 relative to the liquid W that passes through the liquid chamber 41 and generates a flow velocity. Furthermore, the liquid W discharged from the liquid discharge nozzle 44 is guided to the filtration filter 46 to be filtrated and be returned to the liquid supply pump 45. In the liquid supply mechanism 40 of the present embodiment, the liquid W is permitted to gradually leak out from the gap between the frame base part 41a and the frame 41b of the liquid chamber 41 and the upper surface 31a of the holding base 31, the gap between the frame base part 41a and the frame 41b and the transparent plate 42, and so forth. The liquid W that leaks out may be recovered on the base 21 and be caused to flow back to the filtration filter 46. Furthermore, if the liquid W reduces due to the above-described leakage, the liquid W may be supplemented as appropriate from the liquid reservoir tank 47. The liquid reservoir tank 47 is directly attached to the filtration filter 46 and has also a function of discharging air bubbles contained in the liquid W guided to the filtration filter 46.

Based on the configuration as above, the liquid W is circulated in the liquid supply mechanism 40, the liquid supply pump 45, the filtration filter 46, and the liquid reservoir tank 47. The flow velocity of the liquid W that flows in the liquid chamber 41 can be adjusted by adjusting the speed of the rotation of the transparent plate 42 or the pumping efficiency of the liquid supply pump 45 or changing the volume of the liquid chamber 41 or adjusting the opening area of the liquid supply port 41c and the liquid discharge port 41d, and is adjusted to become a predetermined flow velocity.

Figure 4:
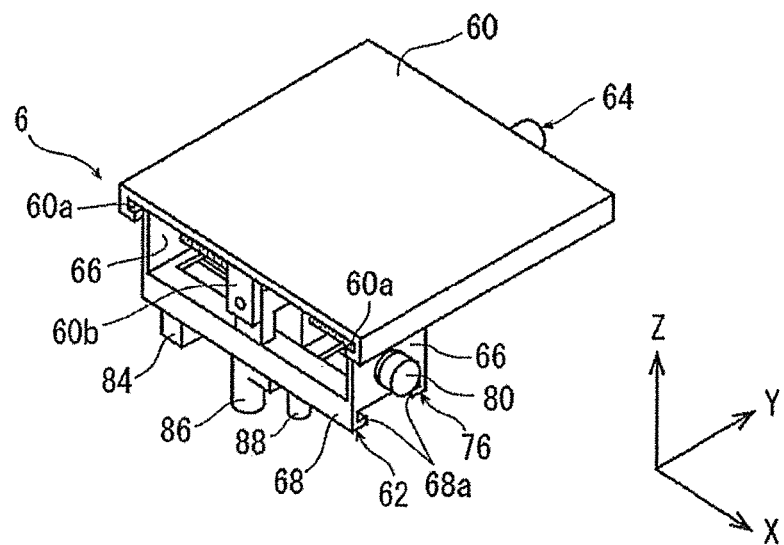
FIG. 4 is a perspective view of a laser beam irradiation unit of the laser processing apparatus depicted in FIG. 1.
Figure 5:
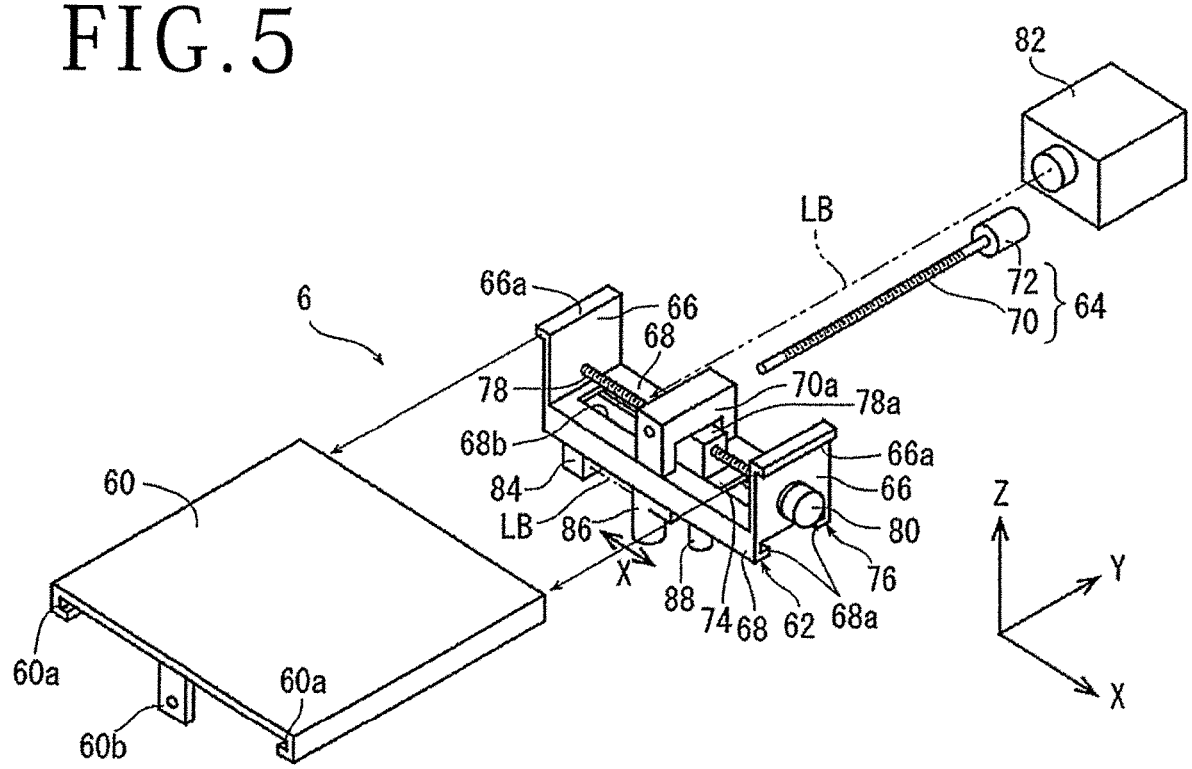
FIG. 5 is an exploded perspective view of the laser beam irradiation unit depicted in FIG. 4.

Next, the laser beam irradiation unit 6 will be described with reference to FIG. 1, FIG. 4, and FIG. 5. FIG. 5 is an exploded perspective view of the laser beam irradiation unit 6 depicted in FIG. 4.

The laser beam irradiation unit 6 includes a guide plate 60 fixed to the lower surface of the horizontal wall part 222 of the frame body 22 by fixing means that is not depicted in the diagram, a Y-axis direction movable member 62 supported by the guide plate 60 movably in the Y-axis direction, and a Y-axis direction movement mechanism 64 that moves the Y-axis direction movable member 62 in the Y-axis direction. A pair of guide rails 60a that extend along the Y-axis direction are formed at the lower parts of both ends of the guide plate 60 in an X-axis direction. As depicted in FIG. 4 and FIG. 5, the Y-axis direction movable member 62 has a pair of guided parts 66 disposed at an interval in the X-axis direction and a mounting part 68 that is made to bridge the space between the lower ends of the guided parts 66 and extends along the X-axis direction. Guided rails 66a that extend along the Y-axis direction are formed at the upper parts of the respective guided parts 66. The guided rails 66a of the guided parts 66 engage with the guide rails 60a of the guide plate 60 and thereby the Y-axis direction movable member 62 is supported by the guide plate 60 movably in the Y-axis direction. Furthermore, a pair of guide rails 68a that extend along the X-axis direction are formed at the lower parts of both ends of the mounting part 68 in the Y-axis direction. The Y-axis direction movement mechanism 64 has a ball screw 70 that extends along the Y-axis direction below the guide plate 60 and a motor 72 joined to a single end part of the ball screw 70. A gate-shaped nut part 70a of the ball screw 70 is fixed to the upper surface of the mounting part 68. The other single end part, to which the motor 72 is not joined, in the ball screw 70 is screwed to the nut part 70a and then is rotatably supported by a support piece part 60b formed at the edge part of the front side of the guide plate 60. Furthermore, the Y-axis direction movement mechanism 64 converts rotational motion of the motor 72 to linear motion and transfers the linear motion to the Y-axis direction movable member 62 by the ball screw 70 to move the Y-axis direction movable member 62 in the Y-axis direction along the guide rails 60a of the guide plate 60.

The description of the laser beam irradiation unit 6 will be continued with reference to FIG. 5. The laser beam irradiation unit 6 further includes an X-axis direction movable plate 74 mounted to the mounting part 68 of the Y-axis direction movable member 62 movably in the X-axis direction and an X-axis direction movement mechanism 76 that moves the X-axis direction movable plate 74 in the X-axis direction. The both end parts of the X-axis direction movable plate 74 in the Y-axis direction engage with the guide rails 68a of the mounting part 68 and thereby the X-axis direction movable plate 74 is mounted to the mounting part 68 movably in the X-axis direction. The X-axis direction movement mechanism 76 has, over the mounting part 68, a ball screw 78 that extends along the X-axis direction and a motor 80 that is joined to a single end part of the ball screw 78 and is supported by one guided part 66. A nut part 78a of the ball screw 78 passes through an opening 68b of the mounting part 68 and is fixed to the upper surface of the X-axis direction movable plate 74. The other single end part, to which the motor 80 is not joined, in the ball screw 78 is rotatably supported by the other guided part 66, to which the motor 80 is not fixed. Furthermore, the X-axis direction movement mechanism 76 converts rotational motion of the motor 80 to linear motion and transfers the linear motion to the X-axis direction movable plate 74 by the ball screw 78 to move the X-axis direction movable plate 74 in the X-axis direction along the guide rails 68a of the mounting part 68.

Figure 6:
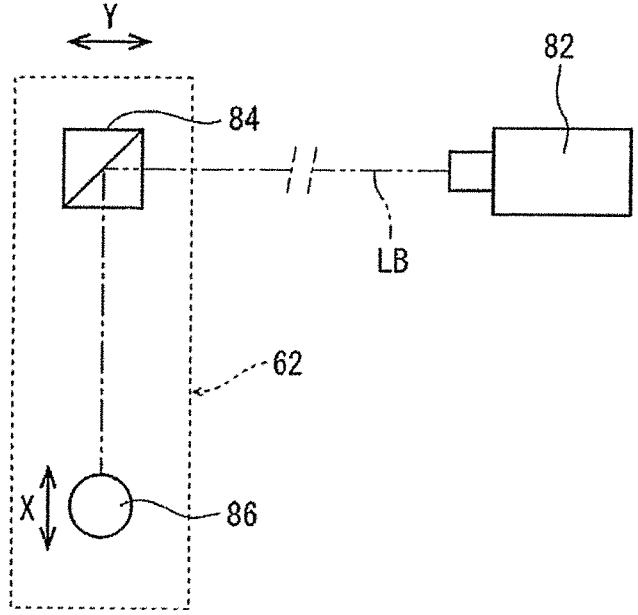
FIG. 6 is a block diagram depicting the outline of an optical system of the laser beam irradiation unit depicted in FIG. 4.

Moreover, the configuration of an optical system of the laser beam irradiation unit 6 will be described with reference to FIG. 5 to FIG. 8. As depicted in FIG. 5, the laser beam irradiation unit 6 includes a laser oscillator 82 that is incorporated in the horizontal wall part 222 of the frame body 22 and oscillates a pulse laser, an attenuator (diagrammatic representation is omitted) that adjusts the output power of a laser beam LB emitted from the laser oscillator 82, and a right-angle prism mirror 84 mounted to the lower surface of the mounting part 68 of the Y-axis direction movable member 62 at an interval from the laser oscillator 82 in the Y-axis direction. The laser beam irradiation unit 6 further includes a condenser 86 mounted to the lower surface of the X-axis direction movable plate 74 movably in the Z-axis direction and a focal spot position adjusting means (diagrammatic representation is omitted) that moves the condenser 86 in the Z-axis direction and adjusts the position of the focal spot of the condenser 86 in the Z-axis direction. The laser oscillator 82 oscillates a laser with such a wavelength (for example, 355 nm) as to be absorbed by the workpiece, for example. As depicted in FIG. 6, the traveling direction of the laser beam LB emitted from the laser oscillator 82 in the Y-axis direction is converted by the right-angle prism mirror 84 by 90 degrees and the laser beam LB is guided to the condenser 86.

Figure 7:
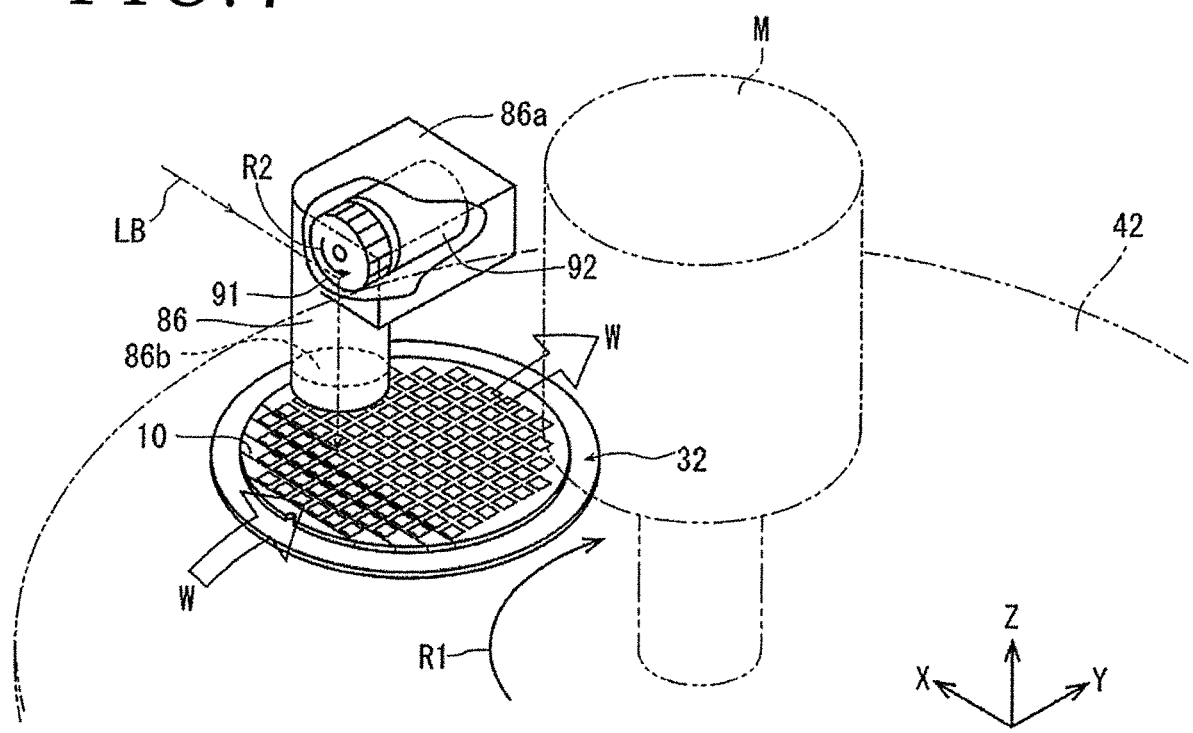
FIG. 7 is a perspective view depicting the state in which laser processing is carried out by the laser beam irradiation unit depicted in FIG. 5.
Figure 8:
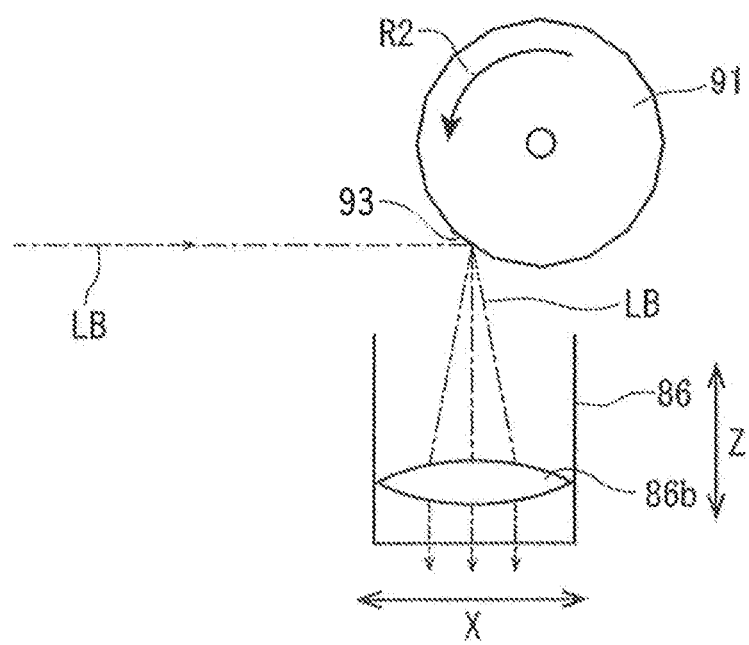
FIG. 8 is a side view of the laser beam irradiation unit explaining the state in which the laser processing depicted in FIG. 7 is carried out.

As depicted in FIG. 7, inside an upper housing 86a of the condenser 86, a polygon mirror 91 as dispersing means that disperses the laser beam LB emitted from the laser oscillator 82, a motor 92 that rotates the polygon mirror 91 at high speed in a direction depicted by an arrow R2, and a condensing lens (fθlens) 86b that condenses the laser beam LB to irradiate the workpiece with the laser beam LB are disposed. As depicted in FIG. 8, in the polygon mirror 91, plural mirrors 93 are disposed concentrically about the rotation axis of the polygon mirror 91. The fθlens 86b is located under the above-described polygon mirror 91 and condenses the laser beam LB to irradiate the workpiece on the holding table 32 with the laser beam LB. The laser beam LB guided from the right-angle prism mirror 84 is guided to the fθlens in such a manner that the irradiation direction thereof is dispersed in the X-axis direction by the rotating mirrors 93, so that irradiation is carried out on the workpiece with dispersion in a predetermined range in the X-axis direction.

Referring back to FIG. 5, on the lower surface of the X-axis direction movable plate 74, an alignment unit 88 mounted at an interval from the condenser 86 in the X-axis direction is disposed together with the condenser 86. The alignment unit 88 images the workpiece held by the holding table 32 and detects a region that should be subjected to laser processing. Moreover, the laser beam irradiation unit 6 includes the focal spot position adjusting means, which is not depicted in the diagram. Although diagrammatic representation of the concrete configuration of the focal spot position adjusting means is omitted, for example, a configuration having a ball screw that has a nut part fixed to the condenser 86 and extends along the Z-axis direction and a motor joined to a single end part of this ball screw may be employed. Based on such a configuration, rotational motion of the motor is converted to linear motion and the condenser 86 is moved along guide rails (diagrammatic representation is omitted) disposed along the Z-axis direction. Thereby, the position, in the Z-axis direction, of the focal spot of the laser beam LB condensed by the condenser 86 is adjusted.

The laser processing apparatus 2 of the present invention substantially has the configuration as described above. The operation thereof will be described below. First, the wafer 10 that is the plate-shaped workpiece in the present embodiment and is composed of silicon (Si) on which devices are formed on a surface is prepared. After the wafer 10 is prepared, the transparent plate 42 depicted in FIG. 1 is temporarily moved outward (in the direction depicted by the arrow A in the diagram) to open the upper side of the liquid chamber 41 and the wafer 10 is placed on the adhesion chuck 32a of the holding table 32 in such a manner that the surface on which the devices are formed is oriented upward. After the wafer 10 is placed on the adhesion chuck 32a, the suction source, which is not depicted in the diagram, is actuated and a suction force is generated on the adhesion chuck 32a to cause the wafer 10 to adhere to the adhesion chuck 32a by suction and be held. After the wafer 10 is held on the adhesion chuck 32a, the transparent plate 42 is moved onto the liquid chamber 41 to make the state in which the liquid chamber 41 is closed.

After the wafer 10 is held on the adhesion chuck 32a and the upper side of the liquid chamber 41 is closed by the transparent plate 42, the liquid reservoir tank 47 is replenished with the sufficient liquid W and the liquid supply pump 45 and the motor M are actuated. As the liquid W supplied to the liquid supply mechanism 40, purified water is used, for example.

Through the elapse of a predetermined time after the start of the actuation of the liquid supply pump 45 and the motor M, the space 41e of the liquid chamber 41 is filled with the liquid W. In addition, the liquid W is accelerated by getting contact with the lower surface of the transparent plate 42 that rotates in the direction depicted by the arrow R1, so that the flow velocity of the liquid W is generated. In this manner, the state in which the liquid W circulates inside the liquid supply mechanism 40 stably and at high speed is obtained.

In the state in which the liquid W circulates stably and at high speed by the liquid supply mechanism 40, the X-axis direction movable plate 74 is moved by the X-axis direction movement mechanism 76 of the laser beam irradiation unit 6 and the Y-axis direction movable member 62 is moved in the Y-axis direction by the Y-axis direction movement mechanism 64 (see FIG. 4 and FIG. 5) to position the alignment unit 88 above the wafer 10. Because the transparent plate 42 is disposed to cover the whole of the holding table 32 from the upper side as described above, the alignment unit 88 can capture all region including the devices on the wafer 10. After the alignment unit 88 is positioned above the wafer 10, the wafer 10 is imaged by the alignment unit 88. At this time, the wafer 10 is imaged through the transparent plate 42 and the liquid W. Subsequently, position adjustment between the wafer 10 and the condenser 86 is carried out based on an image of the wafer 10 imaged by the alignment unit 88. After this position adjustment, the holding table 32 is rotated and the X-axis direction movable plate 74 is moved by the X-axis direction movement mechanism 76. In addition, the Y-axis direction movable member 62 is moved by the Y-axis direction movement mechanism 64. Thereby, planned dividing lines formed in a lattice manner on the wafer 10 are positioned along the X-axis direction and the condenser 86 is positioned to a single end part of the planned dividing line, i.e. the irradiation start position of the laser beam. Subsequently, the condenser 86 is moved in the Z-axis direction by the focal spot position adjusting means, which is not depicted in the diagram, and the focal spot is positioned to the surface height of the single end part in the planned dividing line of the wafer 10.

After the condenser 86 is moved in the Z-axis direction and the focal spot position is set to the surface height of the wafer 10, while the laser beam irradiation unit 6 is actuated, the X-axis direction movable plate 74 is moved in the X-axis direction at a predetermined movement speed by the X-axis direction movement mechanism 76. When the wafer 10 is irradiated with the laser beam LB to carry out laser processing, the polygon mirror 91 is rotated at an appropriate rotational speed by the motor 92 as described based on FIG. 7 and FIG. 8. The positions of the mirrors 93 forming the polygon mirror 91 change along with the rotation of the polygon mirror 91 and thereby the wafer 10 is irradiated with the laser beam LB in a dispersed manner. After the predetermined mirror 93 is irradiated with the laser beam LB, the mirror 93 on the downstream side in the rotation direction R2 of the polygon mirror 91 is irradiated with the laser beam LB, so that the wafer 10 is irradiated with the laser beam LB in a dispersed manner. Such laser processing is repeated while the laser beam LB is emitted from the laser oscillator 82 and the polygon mirror 91 rotates. The number of mirrors 93 forming the polygon mirror 91, the rotational speed of the polygon mirror 91, and so forth are decided as appropriate according to the workpiece.

The laser processing in the above-described laser processing apparatus 2 can be carried out under the following processing condition, for example.

Wavelength of laser beam: 226 nm, 355 nm, 532 nm, 1064 nm

Average output power: 10 to 100 W

Repetition frequency: 0 to 300 MHz

Pulse width: 50 fs to 1 ns

Processing feed rate: 10 to 1000 mm/s

In the present embodiment, the liquid chamber 41 of the liquid supply mechanism 40 is placed on the holding table 32. As depicted in FIG. 7, due to operation of the transparent plate 42 that rotates, the liquid W flows along the rotation direction R1 of the transparent plate 42 substantially equivalent to the Y-axis direction orthogonal to the X-axis direction, which is the direction in which processing feed is carried out. In this state, the laser beam LB is transmitted through the transparent plate 42 and the liquid W and is applied to the planned dividing line on the wafer 10, so that ablation processing is carried out. When the ablation processing is carried out to the surface of the wafer 10, air bubbles are generated in the liquid W existing at the position irradiated with the laser beam LB. In the present embodiment, a flow velocity is generated for the liquid W supplied onto the wafer 10 by the rotation of the transparent plate 42 and the liquid W is made to rapidly flow toward the liquid discharge nozzle 44 (see FIG. 1). Thus, the air bubbles generated near the irradiation position of the laser beam LB are made to rapidly flow to the downstream side of the liquid chamber 41 and be removed. Due to this, in the case of irradiating the wafer 10 with the laser beam LB in a dispersed manner by using the polygon mirror 91, the wafer 10 can be irradiated with the laser beam LB with avoidance of the air bubbles generated due to the ablation processing and favorable ablation processing can be continuously carried out. Moreover, according to the present embodiment, even when debris is generated due to the ablation processing, the debris discharged into the liquid W is rapidly removed from the liquid chamber 41 because the liquid W continuously flows in the liquid chamber 41. This debris discharged into the liquid W is rapidly captured by the filtration filter 46 and therefore is prevented from being circulated into the liquid chamber 41 again.

After the above-described ablation processing is carried out for the predetermined planned dividing line that extends along a first direction, the Y-axis direction movable member 62 is moved in the Y-axis direction by the Y-axis direction movement mechanism 64 and the condenser 86 is positioned to a single end part of a planned dividing line that is adjacent and has not yet been processed, and the same laser processing as the above-described ablation processing is carried out. Then, after the ablation processing is carried out for all planned dividing lines that extend along the first direction, the holding table 32 is rotated by 90 degrees and thereby the same ablation processing is carried out also for planned dividing lines that are orthogonal to the planned dividing lines extending along the first direction and have not yet been processed. In this manner, the ablation processing can be carried out for all planned dividing lines on the wafer 10.

As described above, the space 41e closed by the liquid chamber 41 is formed on the holding table 32 and at least the upper side of the holding table 32 is covered by the transparent plate 42 that rotates. Furthermore, the liquid W is made to flow in the space 41e at a predetermined flow velocity and irradiation with the laser beam is carried out through the transparent plate 42 that rotates and the liquid W to carry out laser processing. Due to this, air bubbles generated from the surface of the wafer 10, debris generated due to the laser processing, and so forth are rapidly removed and do not hinder the laser processing. Furthermore, adhesion of the debris to devices after the processing and so forth are prevented and the quality is not lowered.

In the above-described embodiment, desired laser processing is carried out by placing the wafer 10 as a workpiece on the holding unit 30 fixed onto the base 21 and moving the condenser 86 of the laser beam irradiation unit 6 disposed on the lower surface of the horizontal wall part 222. However, the present invention is not limited thereto. The condenser 86 may be disposed at the tip part of the lower surface of the horizontal wall part 222 in such a manner as to be fixed with respect to the X-axis direction and the Y-axis direction, and laser processing may be carried out in such a manner that the side of the holding unit 30 is moved in the X-axis direction and the Y-axis direction relative to the condenser 86. In this case, the motor M forming the rotation mechanism may be set on the holding unit 30 and the transparent plate 42 may be moved together with the holding unit 30.

Furthermore, in the above-described embodiment, the liquid supply mechanism 40 is disposed on the upper surface 31a of the holding base 31 of the holding unit 30. However, the present invention is not limited the liquid supply mechanism 40 may be disposed above the holding unit 30 by being set on the condenser 86. In this case, the condenser 86 is fixed to the lower surface of the horizontal wall part 222. In addition, the transparent plate 42 that rotates is configured with a circular disc shape smaller than that depicted in FIG. 2 and FIG. 3. Furthermore, it is preferable for the holding base 31 to be configured to move in the X-axis direction (processing feed direction) and the Y-axis direction (indexing feed direction) on the base 21.

In the above-described embodiment, the transparent plate 42 is formed of a glass plate. However, the transparent plate 42 is not limited thereto. It suffices for the transparent plate 42 to be a transparent plate through which the laser beam LB is transmitted and the transparent plate 42 may be a plate made of a resin, such as an acrylic plate, for example.

In the above-described embodiment, the example in which the laser beam LB emitted from the laser oscillator 82 is dispersed by the polygon mirror 91 to be guided to the condensing lens 86*b* is presented. However, the configuration is not limited thereto and a reflective mirror fixedly set may be employed instead of the polygon mirror 91. Moreover, in the above-described embodiment, the example in which the laser processing carried out for the wafer 10 is ablation processing is presented. However, this does not hinder the laser processing from being applied to processing of forming modified layers inside a workpiece (for example, laser processing described in Japanese Patent No. 3408805) and processing of forming so-called shield tunnels (for example, laser processing described in Japanese Patent Laid-open No. 2014-221483).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. Laser processing apparatus comprising:
   a holding unit including a holding table that holds a plate-shaped workpiece;
   a laser beam irradiation unit that irradiates the workpiece held by the holding table with a laser beam and carries out processing; and
   a liquid supply mechanism disposed over the holding unit,
   wherein the liquid supply mechanism includes a liquid chamber having a circular-disc-shaped transparent plate positioned to form a gap between the circular-disc-shaped transparent plate and an upper surface of the workpiece held by the holding table, a liquid supply nozzle that supplies a liquid from one side of the liquid chamber to the gap, a liquid discharge nozzle that discharges the liquid from an other side of the liquid chamber, and a rotation mechanism that rotates the circular-disc-shaped transparent plate and generates a flow velocity in the liquid supplied to the gap, and
   the laser beam irradiation unit includes a laser oscillator that emits the laser beam and a condenser that condenses the laser beam emitted from the laser oscillator and irradiates the workpiece held by the holding table with the laser beam transmitted through the transparent plate and the liquid supplied to the gap.

2. The laser processing apparatus according to claim 1, wherein the laser beam irradiation unit further includes dispersing means that disperses the laser beam emitted from the laser oscillator.

* * * * *